United States Patent [19]
Miller

[11] 3,973,090
[45] Aug. 3, 1976

[54] TELEPHONE NUMBER ASSIGNMENT RECORD VERIFICATION APPARATUS AND METHOD

[75] Inventor: Arthur O. Miller, Dallas, Tex.

[73] Assignee: Hewlett-Packard Company, Palo Alto, Calif.

[22] Filed: Apr. 3, 1975

[21] Appl. No.: 564,927

Related U.S. Application Data

[63] Continuation-in-part of Ser. No. 389,011, Aug. 16, 1973, Pat. No. 3,891,811.

[52] U.S. Cl............................. 179/175.3 A; 324/66
[51] Int. Cl.².......................................... H04B 3/46
[58] Field of Search............ 179/175.3 A, 175.2 R, 179/2 A; 324/66

[56] References Cited
UNITED STATES PATENTS

| | | | |
|---|---|---|---|
| 2,799,739 | 7/1957 | Lowman et al. | 179/175.3 A |
| 2,869,077 | 1/1959 | Houk | 179/175.3 A |
| 3,842,218 | 10/1975 | DeLuca et al. | 179/2 A |

Primary Examiner—Douglas W. Olms
Attorney, Agent, or Firm—Patrick J. Barrett

[57] ABSTRACT

A telephone test and assignment bureau is provided with a telephone instrument interconnected with an automatic wire pair identification field unit. A telephone number to be verified is dialed on the instrument and a start button is illuminated when the connection is completed by the switching equipment. Pressing this button initiates the verification procedure, and the wire pair identification field unit sends an interrogate signal over the telephone line to the central office. A wire pair identification control unit is connected via shoes at the main distributing frame to the cable having the wire pair assigned to the telephone number dialed. When the interrogate signal is received by the wire pair identification control unit it sends an identifying code back over the same telephone line to identify which wire pair on the main distribution frame was selected by the switching equipment in response to the telephone number dialed. This identifying code is received by the wire pair identification field unit in the test and assignment bureau, and the number of the pair is displayed. The displayed number can then be checked against the telephone number assignment records.

9 Claims, 2 Drawing Figures

TELEPHONE NUMBER ASSIGNMENT RECORD VERIFICATION APPARATUS AND METHOD

CROSS REFERENCE TO PRIOR APPLICATION

This application is a continuation-in-part of my co-pending U.S. patent application Ser. No. 389,011 now U.S. Pat. No. 3,891,811 entitled WIRE PAIR IDENTIFICATION SYSTEM filed Aug. 16, 1973.

BACKGROUND OF THE INVENTION

Telephone number assignment records are usually kept at an office or assignment bureau that is physically separated from the telephone switching equipment in the central office. Typically these records show the assignment of the telephone numbers to which the switching equipment responds to the number of the cable and wire pair in the cable that connects the subscriber to the switching equipment. To verify the records of the assignment of particular telephone numbers to particular pairs of wires in cables coming into the central office main distribution frame, it is usually necessary for an assignment clerk to have the assistance of one or two technicians in the central office to physically locate the wires and see what terminals are connected to. Usually the process involves a request by the clerk to find out what number is connected to a particular pair. In response to the request, telephone technicians in the central office will locate the pair on the vertical side of the main distributing frame. One will then physically move the wire so that another technician on the horizontal side of the main distributing frame can locate where it is connected. Once the other end of the wire is located, the proper terminal can be found and the telephone number is posted there in some central offices. In other offices the technician must use an identifying number on the terminal to find the telephone number in other records. In still other offices the technician can simply attach a hand set to the pair to be verified and dial a special number to receive a verbal or visual indication of the telephone assigned to that pair. However, even this method requires the records clerk to be in voice contact with the telephone technician for each pair to be verified or else the clerk must send a copy of the records down and ask the technician to take his time to perform the verification and send the copy of the records back.

SUMMARY OF THE INVENTION

According to a preferred embodiment of the present invention an assignment bureau is provided with an automatic wire pair identification unit which displays identification information about a particular wire pair in a cable on the main distributing frame in response to dialing the telephone number assigned to that wire pair. In the assignment bureau a wire pair identification field unit is connected to a standard telephone instrument to allow the field unit to send and receive signals via the trunk lines and switching equipment connected to the telephone instrument. Thus, when a telephone number is dialed on the telephone instrument, the wire pair identification field unit will be connected to the subscriber wire pair on the central office main distributing frame assigned to that telephone number. In order to verify the assignments of wire pairs in a particular cable or cables to certain telephone numbers, a wire pair identification control unit is attached by shoes to the wire pairs of interest on the main distributing frame. Then a telephone number is dialed; and, when the connection is completed, a start button is pushed to send an interrogate signal from the wire pair identification field unit to the control unit. When the control unit receives the interrogate signal, it sends back an identifying code to identify on which wire pair the interrogate signal was received. This identifying code is displayed on the wire pair identification field unit for comparison with the assignment records. The process is then repeated for each number to be verified.

DESCRIPTION OF THE PREFERRED EMBODIMENT

Allowed patent application Ser. No. 389,011 entitled WIRE PAIR IDENTIFICATION SYSTEM filed Aug. 16, 1973 by Arthur O. Miller is hereby incorporated by reference. Since the referenced application fully describes the structure and operation of the wire pair identification field and control units referred to herein, they will not be further discussed here except as is necessary to describe the operation of the present invention. To aid in understanding the interconnections between the elements described below and the wire pair identification units, the same reference designators are used in this application for like elements as in the referenced application.

Figure 1:
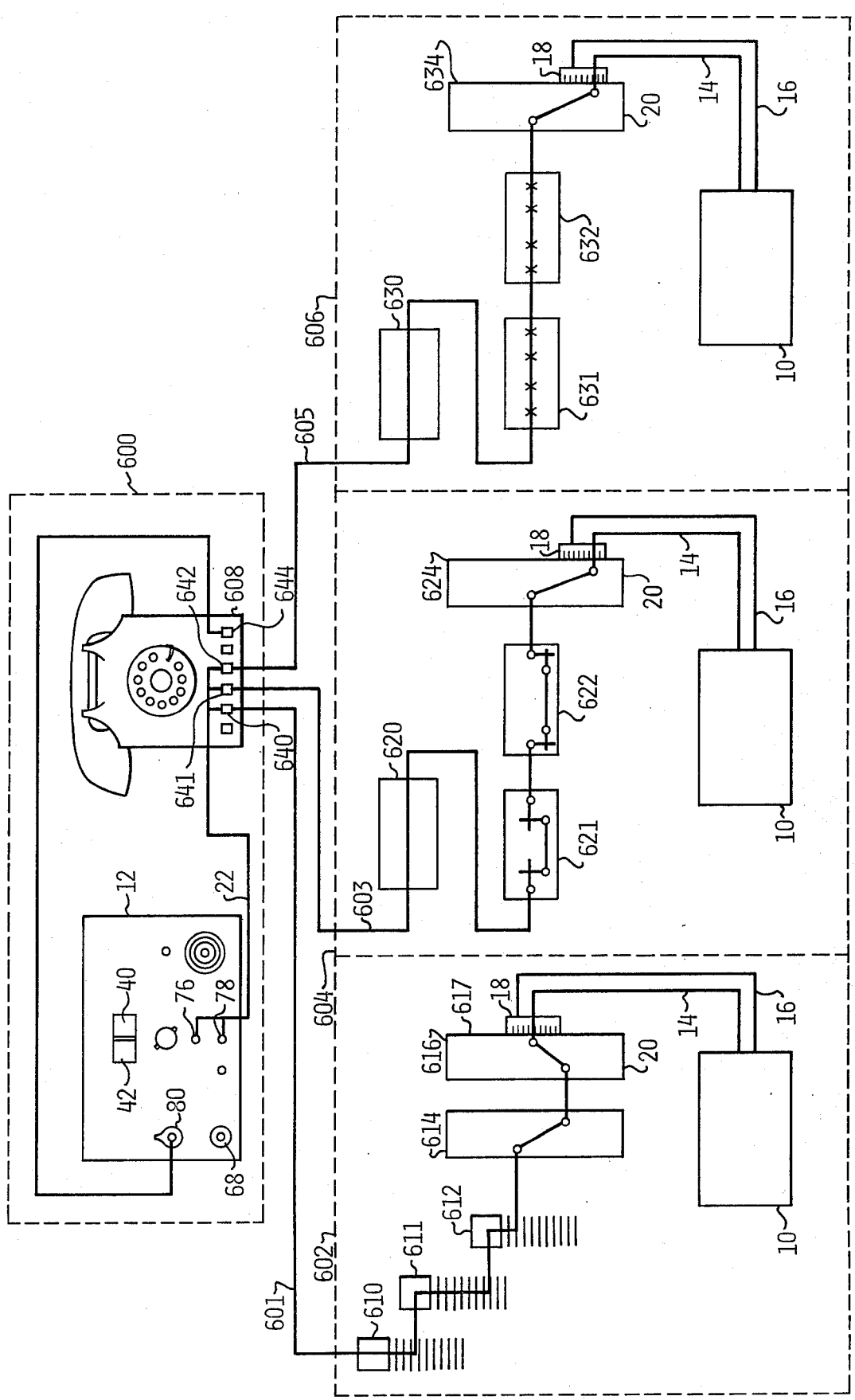
FIG. 1 shows a block diagram of a preferred embodiment of the present invention connected to several different kinds of telephone central offices.

FIG. 1 shows a schematic illustration of a test and assignment bureau 600 connected via trunk lines 601, 603 and 605 respectively to a step-by-step central office 602, a crossbar central office 604, and electronic switching central office 606. The trunk lines illustrated are dedicated test or verification trunk lines which have their own switching equipment in the central office and may be used to access any line in the central office without disturbing the subscriber. Trunk line 601 is connected to various dedicated step-by-step selector switches 610 through 612. These switches, in turn, select a particular group and terminal on intermediate distribution frame 614 in accordance with the telephone number which has been dialed on a telephone instrument 608 connected to trunk line 601 in the test and assignment bureau. The intermediate distribution frame is in turn connected to the main distribution frame 616 where the cable pair going to the subscriber's location is located. A front tap shoe 18 is attached to the vertical side 617 of the main distributing frame to make connection with the cable including the subscriber's wire pair being verified. Front tap shoe 18 is connected by cables 14 and 16 to a cable pair identification control unit 10.

Similarly, trunk line 603 is connected to an operator verification trunk circuit 620 which connects to a distributing frame 624 via a trunk link frame 621 and line link frame 622 in crossbar central office 604. On distributing frame 624 a front tap shoe 18 is shown connected to the pair being tested with cable 14 and 16 connected to control unit 10. Trunk line 605 to electronic switching central office 606 is connected through trunk link network frame 631 and line link network frame 632 to a distributing frame 634. The cable pair of interest is connected via front tap shoe 18 to control unit 10.

In test and assignment bureau 600 a modified telephone instrument 608, described in greater detail below, is shown connected to each of the three trunk lines 601, 603 and 605 and to a pair identification field unit 12. Line pickup keys 640 through 642 on telephone instrument 608 are connected respectively to trunk lines 601, 603 and 605. In turn, the tip and ring jacks 76 and 78 of field unit 12 are connected via cable 22 to pickup keys 640 through 642. Thus by actuating the appropriate line pickup key, lifting the receiver off the hook and dialing a desired telephone number, field unit 12 may be connected via the switching equipment in any of the central offices to a cable pair assigned to the telephone number dialed. When trunk lines are wired directly to dedicated switching equipment, it is usually not necessary to dial the entire seven digit telephone number to access a particular cable pair. Usually the prefix may be omitted and only the last four or five digits of the telephone number, depending upon the size of the central office, need be dialed.

Initiation of the interrogate signal from field unit 12 may be controlled from telephone instrument 608 by modifying line pick-up key 644 to be a momentary switch and connecting it to the external start input 80 of field unit 12. The light under line pickup key 644 is rewired so that it will be illuminated when the connection through the switching equipment is completed, thus indicating that there is an electrical path between the telephone instrument and the vertical side of the particular distributing frame of interest. When this light turns on, the field unit 12 may be started by depressing line pickup key 644. The rest of the operation is automatic, and displays 40 and 42 will indicate the number of the wire pair selected by the switching equipment in response to the telephone number that was dialed.

The procedure for verifying the assignment of telephone numbers to particular cable pairs is much simplified through the use of the above-described system, as compared with prior art methods. In practice, an assignment clerk calls a particular central office and requests a technician to place the front tap shoe 18 on the group of wire pairs to be verified. Thereafter no further assistance from the technician is ordinarily necessary. The assignment clerk then dials each of the phone numbers to be verified and checks the assignment record against the cable pair indication on field unit 12. The same method can be used for verifying other assignment records such as the assignment of a telephone number to a particular group and terminal in a step-by-step central office.

Figure 2:
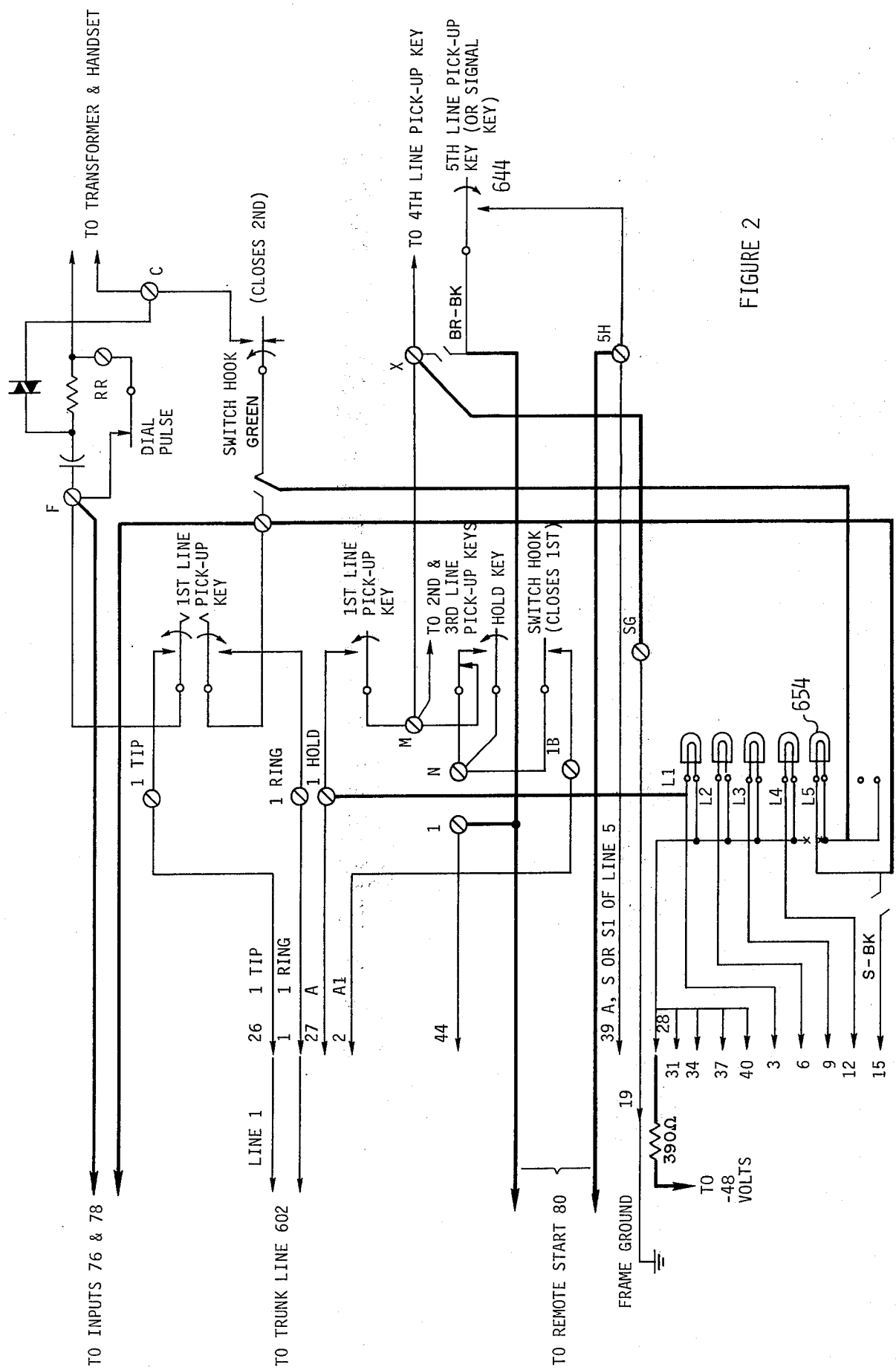
FIG. 2 shows a schematic diagram of the modifications made to a standard telephone instrument to connect it to a wire pair identification system field unit.

FIG. 2 shows the modifications that may be made to a standard Western Electric model 564HK or 564HL telephone set to connect it to field unit 12. Only those portions of the telephone set circuit that have been modified to effect interconnection with field unit 12 are shown in FIG. 2. The numbers on the various terminals shown in the figure are the same as those marked on the actual instrument. The connection between tip and ring jacks 76 and 78 on field unit 12 and telephone instrument 608 are made to terminals "F" and "9" respectively. The remote start input 80 is connected across the fifth line pickup key 644 which is modified to be a momentary contact switch. The light 654 associated with the fifth line pickup key 644 is connected in series with the line to ring jack 78. When a typical call is completed the central switching office grounds the tip portion of trunk line 602 and applies a negative 48 volt potential to the ring portion of trunk line 602. A voltage potential is coupled through the 1st line pick-up key to a first terminal of light 654. The grounded tip portion of trunk line 602 is coupled by means of the 1st line pick-up key, terminal F, resistance RR, a pair of closed contacts and the closed switch hook to a second terminal of light 654 as shown in FIG. 2, thereby lighting light 654 when a connection through the central switching office equipment is complete. Although only the connections to trunk line 602 are shown in the figure, the other trunk line connections are made in a similar fashion in accordance with standard practice.

Although the use of the automatic pair identification system for record verification has been illustrated with a model 564 telephone set, it will be understood by those skilled in the art that other telephone instruments such as 600 series call directors could be used in this application, especially if additional trunk lines were desired. In addition, features such as a release key to release the line, instead of using the switch hook each time, could be provided to increase user convenience. It will also be understood that the term "dialing" includes the use of push button or other telephone number signaling devices as well as the standard telephone dial.

I claim:

1. An apparatus for identifying one of a plurality of groups of wires connected to a switching network which selects one of the wire groups in response to a code received over another of the wire groups and electrically connects the selected wire group to the other wire group, the apparatus comprising:
   code generating means for connection to a first of the wire groups for generating a code to cause the switching network to connect the first wire group to a second of the wire groups;
   field means connected to the code generating means for transmitting an interrogate signal and receiving an identifying signal identifying the second wire group; and
   control means for connection to a selected number of the plurality of wire groups including the second wire group for generating the identifying signal in response to receipt of the interrogate signal.

2. An apparatus as in claim 1 wherein:
   the switching network is telephone switching equipment including a distributing frame having terminals for the wire groups;
   the control means is connected to the distributing frame; and
   the code generating means is a telephone instrument having a signaling mechanism for sending a coded signal representing a telephone number.

3. An apparatus as in claim 2 wherein:
   the interrogate signal is sent via the first wire group, the switching network and the second wire group to the control means; and
   the identifying signal is sent via the second wire group, the switching network and the first wire group to the field means.

4. An apparatus as in claim 3 wherein the telephone instrument includes a plurality of line selector switches for selecting one of a plurality of first groups of wires connected to telephone switching equipment and an indicator for signaling the completion of the electrical connection through the telephone switching equipment.

5. An apparatus as in claim 3 wherein:
each group of wires comprises a pair of wires;
the field means includes interface means for connecting the field means to the telephone instrument, transmitting means connected to the interface means for generating and transmitting the interrogate signal, and receiving means connected to the interface means for receiving, decoding and displaying the identifying signal; and
the control means includes interface means for connecting the control means to the distributing frame, receiving means connected to the interface means for receiving the interrogate signal and giving an output signal in response to receiving the interrogate signal and signal generating and transmitting means connected to the interface means and the receiving means for generating and transmitting the identifying signal in response to the receiving means output signal.

6. An apparatus as in claim 5 wherein:
the control means receiving means includes scanning means for scanning each of the wire pairs to which the control means is connected, and identifying means for determining the identity of the wire pair on which the interrogate signal was received.

7. A method of verifying the assignment of a switching code to one group of a plurality of groups of wires connected to switching equipment which connects selected groups of wires together in response to predetermined switching codes, the method comprising the steps of:
generating, at a first location, a switching code and transmitting the switching code on a first group of wires to the switching equipment for causing the switching equipment to electrically connect the first group of wires to a second group of wires;
transmitting from the first location an interrogate signal via the first group of wires and the switching equipment to the second group of wires at a second location;
transmitting from the second location an identifying signal via the second group of wires, the switching equipment and the first group of wires in response to receipt of the interrogate signal, the identifying signal identifying the second group of wires; and
receiving and displaying the identifying signal at the first location.

8. A method as in claim 7 wherein the switching equipment is telephone switching equipment, the switching code is a telephone number, and the step of generating a switching code comprises dialing a telephone number.

9. A method as in claim 8 wherein the step of transmitting an identifying signal includes the steps of receiving the interrogate signal and determining the identity of the group of wires over which the interrogate signal was received.

* * * * *